(12) United States Patent
Miyazawa

(10) Patent No.: US 7,253,513 B2
(45) Date of Patent: Aug. 7, 2007

(54) HIGH-FREQUENCY SWITCH DEVICE AND ELECTRONIC DEVICE USING THE SAME

(75) Inventor: Naoyuki Miyazawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/396,462

(22) Filed: Mar. 26, 2003

(65) Prior Publication Data

US 2003/0183928 A1 Oct. 2, 2003

(30) Foreign Application Priority Data

Mar. 28, 2002 (JP) .............................. 2002-093376

(51) Int. Cl.
*H01L 23/34* (2006.01)
*H01L 23/52* (2006.01)

(52) U.S. Cl. ....................... 257/691; 257/728; 257/773; 257/E25.012; 257/E23.01; 257/E23.153

(58) Field of Classification Search ................ 257/207, 257/208, 691, 728, 773, 786, E25.012, E25.016, 257/E23.01, E23.151, E23.153

See application file for complete search history.

(56) References Cited

U.S. PATENT DOCUMENTS 6,380,823 B1   4/2002  Ikata et al.
6,657,266 B2 * 12/2003  Hirai et al. ................. 257/393

2003/0127749 A1 *  7/2003  Lin et al. .................... 257/778
2005/0190018 A1 *  9/2005  Kawai et al. ............... 333/235

FOREIGN PATENT DOCUMENTS

| JP | 01251640 A | * 10/1989 |
| JP | 4-176162 | 6/1992 |
| JP | 6-310558 | 11/1994 |
| JP | 8-213472 | 8/1996 |
| JP | 8-251089 | 9/1996 |
| JP | 8-307305 | 11/1996 |
| JP | 10-150395 | 6/1998 |
| JP | 10-190380 | 7/1998 |
| JP | 2000-165101 | 6/2000 |
| JP | 2000-341002 | 12/2000 |
| JP | 2000-349502 | 12/2000 |
| JP | 2000-349586 | 12/2000 |
| JP | 2001-326333 | 11/2001 |

OTHER PUBLICATIONS

Office Action mailed on Nov. 30, 2004 in the counterpart Japanese application 2002-093376.
Office Action dated Apr. 3, 2007 in corresponding Japanese application No. 029255.

* cited by examiner

*Primary Examiner*—Kenneth Parker
*Assistant Examiner*—Matthew E. Warren
(74) *Attorney, Agent, or Firm*—Westerman, Hattori, Daniels & Adrian, LLP.

(57) ABSTRACT

A switch device includes a semiconductor chip, and at least two switches formed on the semiconductor chip. Ground parts of the at least two switches are arranged between said at least two switches.

20 Claims, 12 Drawing Sheets

HIGH-FREQUENCY SWITCH DEVICE AND ELECTRONIC DEVICE USING THE SAME

BACKGROUND OF THE INVENTION

1. Field of the Invention

The present invention generally relates to high-frequency switch devices capable of switching a high-frequency signal, and more particularly, to a high-frequency switch device using a compound semiconductor such as GaAs.

2. Description of the Related Art

A high-frequency switch device that handles high frequencies (RF) over hundreds of MHz is required to have an ability of switching high-frequency signals with low insertion loss. A high-frequency switch device using the compound semiconductor is known as a switch device that meets the above requirement.

FIG. 1 is a circuit diagram of this type of high-frequency switch device, and FIG. 2 is a schematic plan view of the switch device. The circuit shown in FIG. 1 is known as an SPDT (Single Pole Dual Throw) switch. The switch device includes four field effect transistors FET11, FET12, FET21 and FET22. A control voltage Vcon1 is applied to the gates of FET11 and FET22, a control voltage Vcon2 is applied to the gates of FET12 and FET21. FET11 and FET21 are connected in series between signal terminals T1 and T2. A signal terminal PC is connected to an intermediate node via which FET11 and FET21 are connected in series. The signal terminal PC corresponds to a movable contact of the switch, while the signal terminals T1 and T2 correspond to stationary contacts. The signal terminal T1 is connected to ground GND1 via FET12, and the signal terminal T2 is connected to ground GND2 via FET22.

When FET11 and FET22 are ON, FET21 and FET12 are OFF. Similarly, when FET21 and FET12 are ON, FET11 and FET22 are OFF. The controls voltages Vcon1 and Vcon2 are used to realize the above-mentioned ON/OFF control. When FET11 is ON, the signal terminal PC is connected to the signal terminal T1, and the signal terminal PC is isolated from the signal terminal T2. At this time, the FET22 is ON and sets the signal terminal T2 at the ground potential.

Referring to FIG. 2, the high-frequency switch device of FIG. 1 is formed on a GaAs substrate (GaAs chip) 10. Squares on the GaAs chip 10 denote pads. Symbols given to the pads correspond to those shown in FIG. 1. The circuit of FIG. 1 is schematically illustrated with a symbol of switch having one movable contact and two stationary contacts.

FIG. 3A shows a circuit using two high-frequency switch devices, each having the configuration shown in FIG. 1. Each of switches SW1 and SW2 is a high-frequency switch device configured as shown in FIGS. 1 and 2. Filters FLT1 and FLT2 are band-pass filters that have different center frequencies. The switches SW1 and SW2 cooperate with each other to select either the filter FLT1 or FLT2. The switches SW1 and SW2 are formed by individual chips and are therefore spaced apart from each other. Thus, as shown in FIG. 3B, the electromagnetic coupling between the switches SW1 and SW2 (the electric field lines indicated by an arrow) is weak, so that a sufficient isolation level more than 50 dB can be secured. The above isolation (attenuation) is much lower than 40 dB that is usually required as an attenuation level in the suppressed frequency ranges of the filters FLT1 and FLT2. Thus, the filters FLT1 and FLT2 perfectly exhibit the original performance.

However, a problem occurs in such a case where the two switches SW1 and SW2 are integrated on a single GaAs chip 12 having 1–2 mm□, as shown in FIG. 4A. In this case, the pads and the FETs of the switches SW1 and SW2 are adjacent via a gap or spacing of hundreds of μm, and are spatially close to each other. Thus, only an isolation level as small as about 30 dB can be secured between the switches SW1 and SW2, as shown in FIG. 4B. The isolation level of 30 dB is worse than the attenuation level of 40 dB available in the suppressed frequency ranges of the filters FLT1 and FLT2. That is, the filters FLT1 and FLT2 have an attenuation level of 40 dB in the suppressed frequency ranges, nevertheless, the whole device shown in FIG. 4A has only an attenuation of 30 dB in the suppressed frequency ranges. This means that there is difficulty in arrangement of multiple switches on the single chip. In other words, there is difficulty in miniaturization of the semiconductor chip.

SUMMARY OF THE INVENTION

The present invention has been made in view of the above circumstances and provides a high-frequency switch device and an electronic device using the same.

According to one aspect of the present invention, there is provided a switch device comprising: a semiconductor chip; and at least two switches formed on the semiconductor chip, ground parts of said at least two switches being arranged between said at least two switches.

According to another aspect of the present invention, there is provided a switch device comprising: a semiconductor chip; at least two switches formed on the semiconductor chip; and a ground member, arranged between said at least two switches, for reducing an electromagnetic coupling between stationary contacts of said at least two switches.

According to yet another aspect of the present invention, there is provided an electronic device comprising: a switch device; and a wiring board on which the switch device is mounted, the switch device comprising a semiconductor chip and at least two switches formed on the semiconductor chip, ground parts of said at least two switches being provided between said at least two switches and being electrically connected to a ground formed on the wiring board.

According to a further aspect of the present invention, there is provided an electronic device comprising: a switch device in a package and components connected to the switch device, the switch device comprising a semiconductor chip and at least two switches formed on the semiconductor chip, said at least two switches having respective ground portions provided between said at least two switches, the switch device selectively connecting the components between input and output terminals supported by the package.

According to a still further aspect of the present invention, there is provided an electronic device comprising: a signal processing circuit and a module, the module comprising a switch and components, the switch device comprising a semiconductor chip and at least two switches mounted on the semiconductor chip, said at least two switches having respective ground portions provided between said at least two switches, the switch device selectively connecting the components between input and output terminals of the module.

BRIEF DESCRIPTION OF THE DRAWINGS

The present invention and embodiments thereof will be described in detail with reference to the accompanying drawings, wherein.

DESCRIPTION OF THE PREFERRED EMBODIMENTS

A description will now be given, with reference to the accompanying drawings, of embodiments of the present invention.

(First Embodiment)

Figure 1:
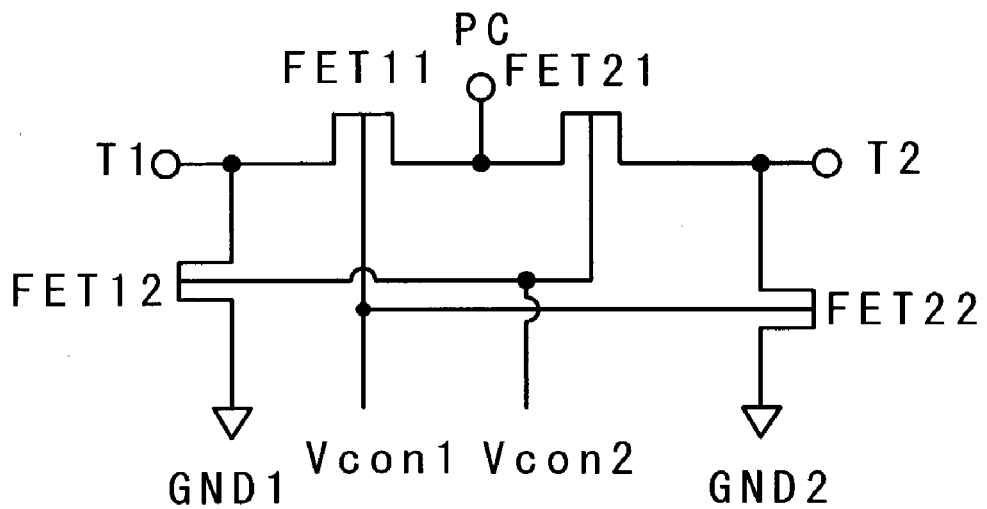
FIG. 1 is a circuit diagram of a high-frequency switch device.
Figure 2:
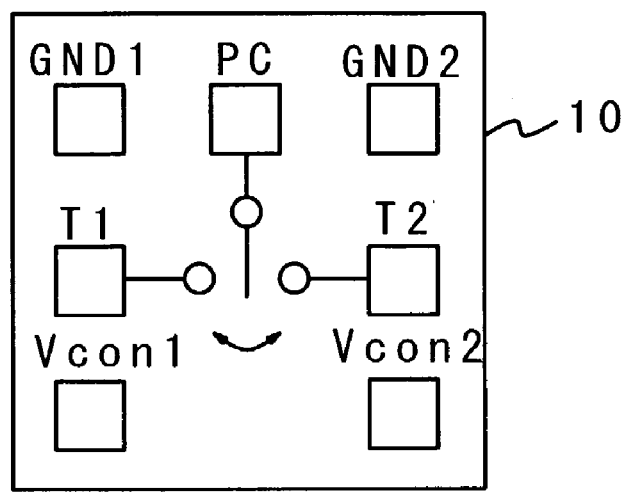
FIG. 2 is a schematic plan view of the high-frequency switch device shown in FIG. 1.
Figure 3A:
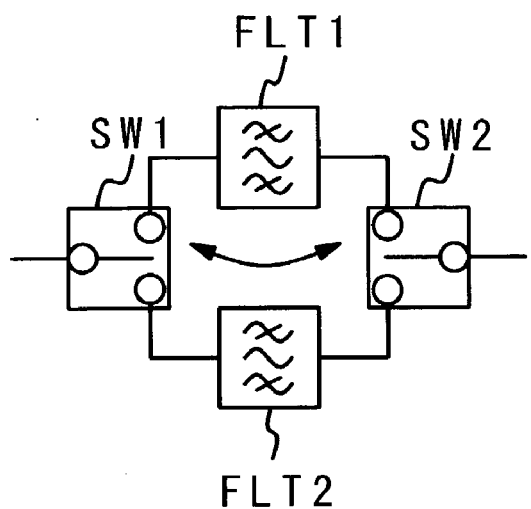
FIG. 3A is a filter device equipped with two high-frequency switch devices each being configured as shown in FIGS. 1 and 2.
Figure 3B:
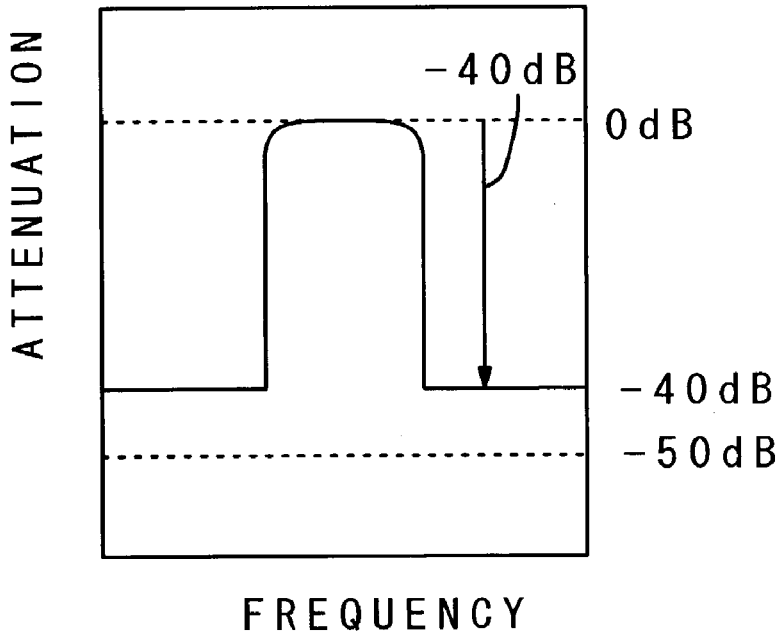
FIG. 3B is a graph of the frequency characteristic of the filter device shown in FIG. 3A.
Figure 4A:
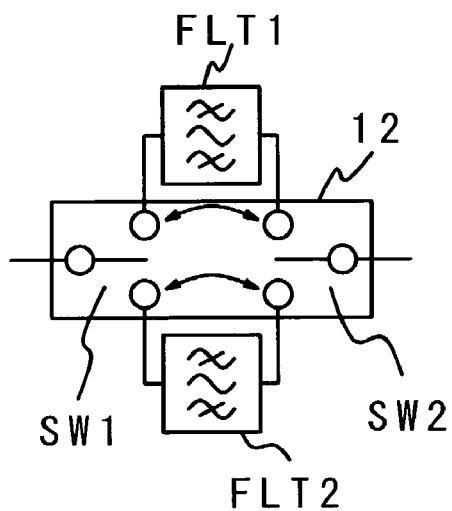
FIG. 4A illustrates a structure of the filter device shown in FIG. 3A by using a single semiconductor chip.
Figure 4B:
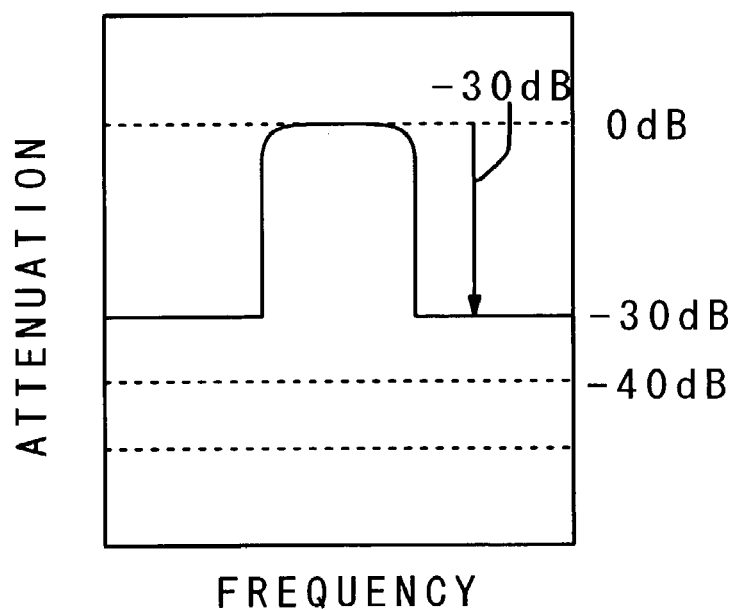
FIG. 4B is a graph of the frequency characteristic of the filter device shown in FIG. 4A.
Figure 5:
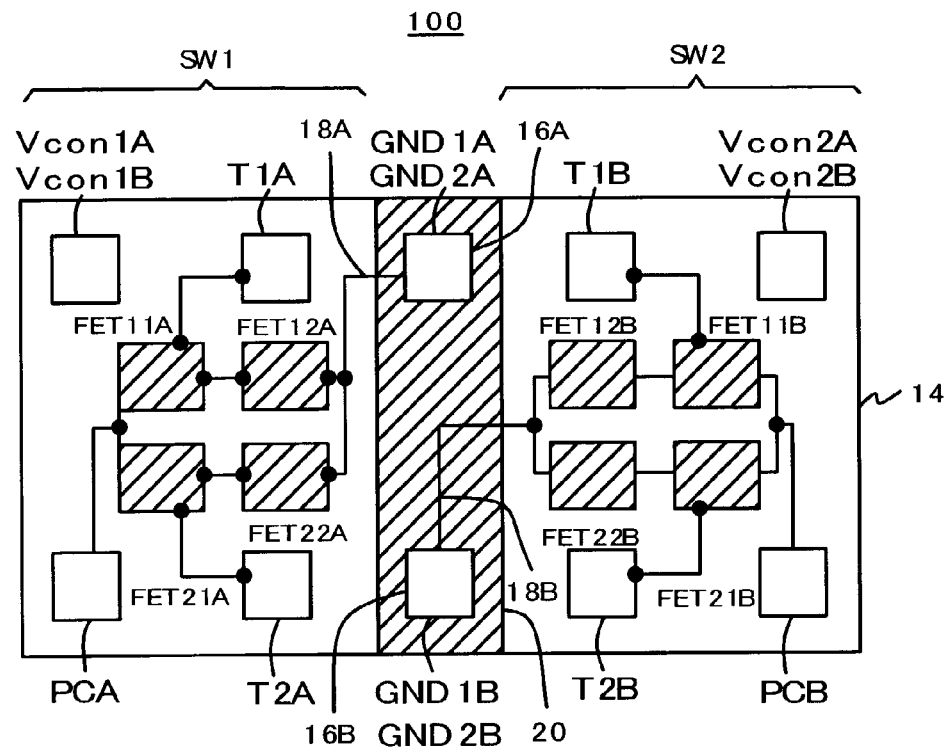
FIG. 5 is a schematic plan view of a high-frequency switch device according to a first embodiment of the present invention.

FIG. 5 is a plan view of a high-frequency switch device according to a first embodiment of the present invention. A high-frequency switch device 100 of FIG. 5 has two circuits formed on a compound semiconductor substrate 14 made of, for example, GaAs, wherein each of the two circuits is configured as shown in FIG. 1. One of the two circuits is given reference numerals with "A" being added thereto, and the other circuit is given reference numeral with "B" being added thereto. An FET that corresponds to FET11 shown in FIG. 1 is denoted by FET11A and FET11B in the two circuits. The layout shown in FIG. 5 contributes to solving the problem shown in FIG. 4B arising from the layout shown in FIG. 4A in which two switches are formed on the single chip.

A first switch SW1 is located on the left side of the semiconductor chip 14, and a second switch SW2 is located on the right side thereof. Two grounds GND1A and GND2A of the switch SW1 are provided by a ground pad 16A, which serves as a ground part. The sources of FET12A and FET22A are connected to the ground pad 16A via a ground line 18A. Similarly, two grounds GND1B and GND2B of the switch SW2 are provided by a ground pad 16B serving as a ground part. The sources of FET12B and FET22B are connected to the ground pad 16B via a ground line 18B.

The ground pad 16A of the switch SW1 and the ground pad 16B of the switch SW2 are disposed between the two switches SW1 and SW2. In the arrangement shown in FIG. 5, the ground pads 16A and 16B are located in the middle of the spacing between the switches SW1 and SW2. It can be said that the two switches SW1 and SW2 are located in each side of an imaginary line connecting the ground pads 16A and 16B. When the ground pads 16A and 16B are set at the ground potential, a ground region 20 illustrated by hatching in FIG. 5 is formed. The ground region 20 electromagnetically isolates the switches SW1 and SW2 from each other. The electric field lines that originate from the switches SW1 and SW2 end with the ground pads 16A and 16B, and the electric field lines that originate from the ground pads 16A and 16B end with the switches SW1 and SW2. The ground region 20 formed by the ground pads 16A and 16B at the ground potential suppresses or weakens the electromagnetic coupling between the switches SW1 and SW2. It is therefore possible to arrange the switches SW1 SW2 closer. As a result, the integration density of the switch device can be increased, and the switch device can be miniaturized.

The ground pads 16A and 16B will provide the effect of isolation as long as the ground pads 16A and 16B are interposed between the switches SW1 and SW2. Thus, the ground pads 16A and 16B may be arranged so as to be closer to each other. Even in this arrangement, the same advantages can be provided. It is to be noted that the ground member for forming the ground region 20 between the switches SW1 and SW2 is not limited to the arrangement shown in FIG. 5 but various ground members may be used as will be described later.

In FIG. 5, for the sake of simplicity, the following are intentionally omitted from FIG. 5: an interconnection line for connecting a pad to which the control voltage Vcon1A (=Vcon1B) and the associated FETs, and an interconnection line for connecting a pad to which the control voltage Vcon2A (=Vcon2B) and associated FETs.

Figure 6:
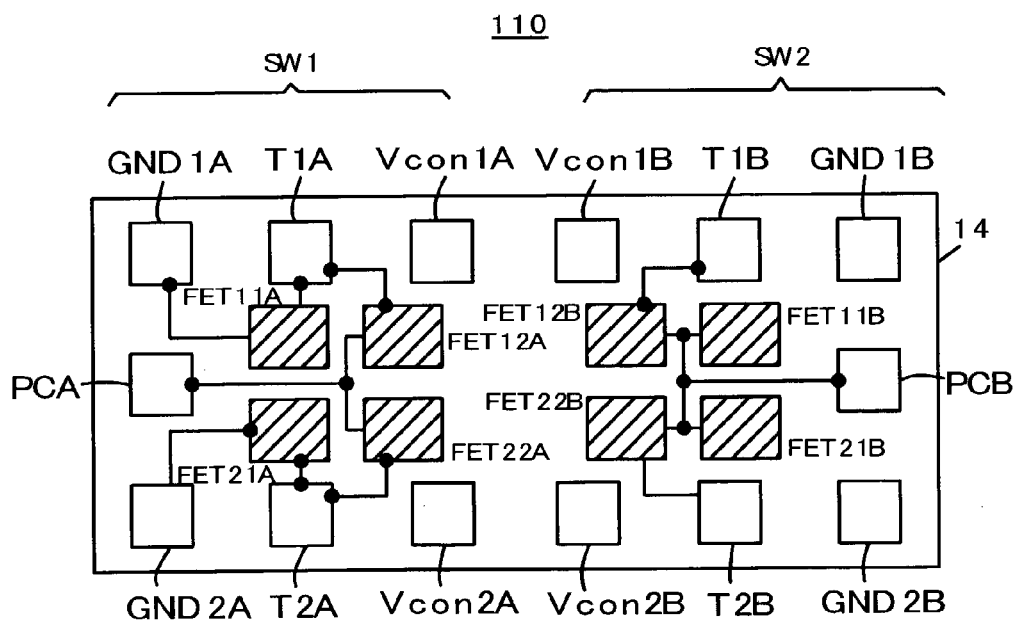
FIG. 6 is a schematic plan view of a comparative example.

FIG. 6 shows a comparative example. The comparative example is a high-frequency switch device 110 on which two circuit confirmations each shown in FIG. 1 are formed on the semiconductor chip 14 so as to make a mirror inversion of arrangement. As is shown in FIG. 6, two ground pads GND1A and GND2A of the switch SW1 are located at the left corners of the semiconductor chip 14, and similarly, two ground pads GND1B and GND2B of the switch SW2 are located at the right corners thereof. There is nothing that is interposed between FET12A and FET12B and functions to electrically isolate them from each other. Similarly, there is nothing that is interposed between FET22A and FET22B and functions to electrically isolate them from each other. As has been described previously, the distance between the adjacent transistors is only hundreds of μm on the semiconductor chip of 1–2 mm□. Thus, strong electromagnetic coupling develops between the adjacent elements and causes the above-mentioned problem.

Figure 7A:
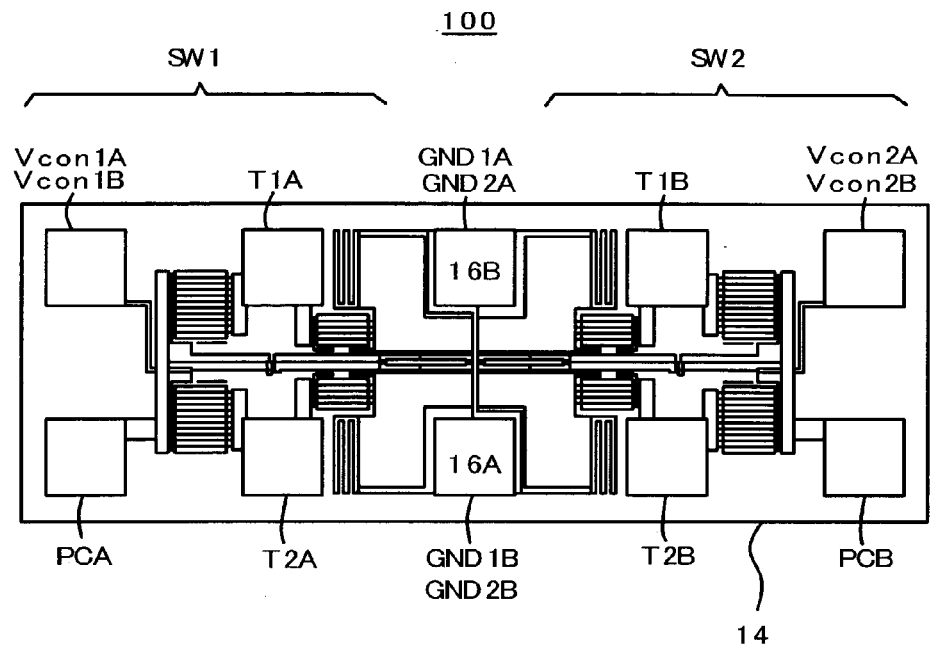
FIG. 7A is a plan view of the detail of the high-frequency switch device shown in FIG. 5.
Figure 7B:
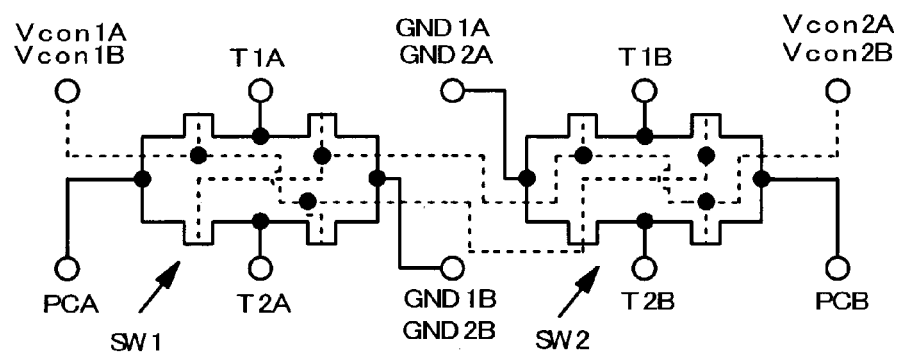
FIG. 7B is a circuit diagram of the high-frequency switch device shown in FIG. 7A.
Figure 7C:
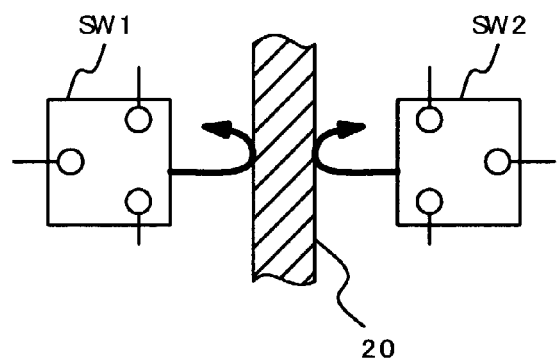
FIG. 7C is a diagram illustrating advantages of the high-frequency switch device shown in FIGS. 7A and 7B.

FIG. 7A is a plan view illustrating the detail of the layout shown in FIG. 5. It is to be noted that the positions of the ground pads 16A and 16B shown in FIG. 7A are different from those shown in FIG. 5 and are illustrated upside down. The arrangement of the ground pads 16A and 16B shown in either FIG. 5 or FIG. 7A may be employed. FIG. 7B is a circuit diagram of the circuit realized by the layout shown in FIG. 7A, the diagram being depicted so as to correspond to the layout. The ground pads 16A and 16B are located between the switches SW1 and SW2. The arrangement of the ground pads 16A and 16B may be described in view of other pads as follows. The ground pad 16A is located closer to the pads T1A and T2A of the switch SW1 serving as the stationary contacts than the pad PCA serving as the movable contact thereof. Similarly, the ground pad 16B is located closer to the pads T1B and T2B serving as the stationary contacts of the switch SW2 than the pad PCB serving as the movable contact thereof. The above arrangement may be schematically illustrated as shown in FIG. 7C. As has been described, when the ground pads 16A and 16B are set at the ground potential, the ground region 20 is formed between the switches SW1 and SW2. The ground region 20 functions to suppress the electromagnetic couples between the stationary contacts T1A and T2A of the switch SW1 and the stationary contacts T1B and T2B of the switch SW2. That is, the output side of the switch SW1 is electromagnetically isolated from the input side of the switch SW2, so that sufficient isolation can be secured between the switches SW1 and SW2.

Figure 8A:
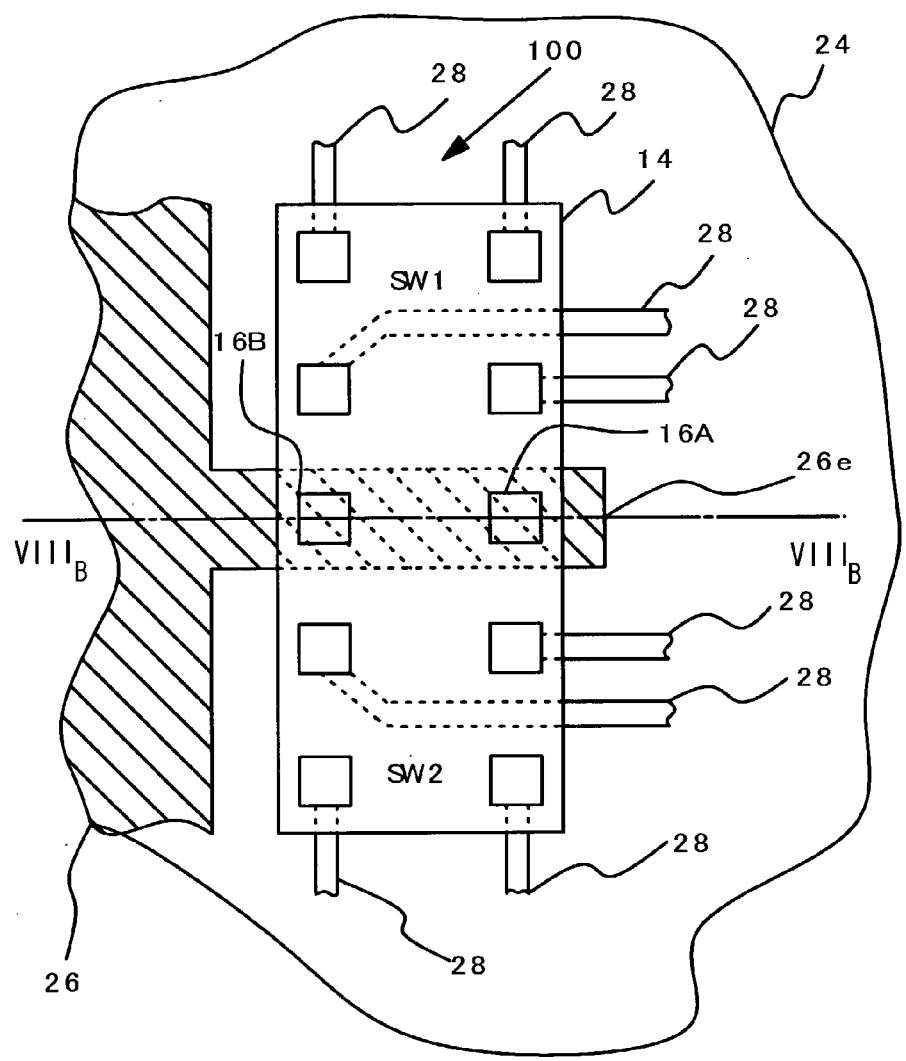
FIG. 8A is a plan view of an electronic device equipped with the high-frequency switch device mounted on a wiring board in flip-chip style according to the first embodiment of the present invention.
Figure 8B:
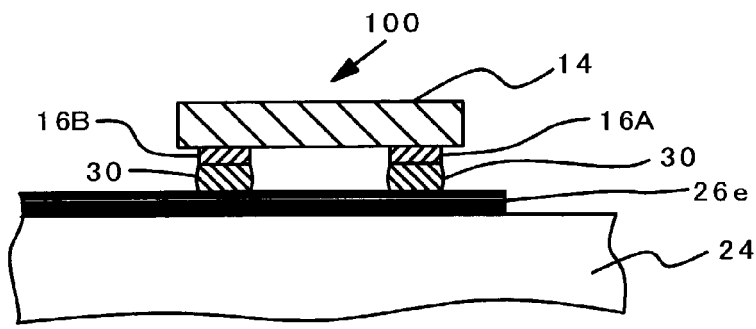
FIG. 8B is a cross-sectional view taken along a line $VIII_B$—$VIII_B$ shown in FIG. 8A.

FIG. 8A is a plan view of flip-chip mounting of the high-frequency switch device 100 according to the first embodiment of the present invention. It is to be noted that FIG. 8A is illustrated so that the pads on the semiconductor chip 14 are seen therethrough from the back surface (which is the upper surface in the mounted state) thereof. FIG. 8B is a cross-sectional view taken along a line VIII$_B$—VIII$_B$ shown in FIG. 8A. A patterned ground metal 26 is formed on a wiring board (mount board) 24. The ground metal 26 has a ground contact portion 26e, which has a rectangular shape. The ground pads 16A and 16B of the switch device 100 in flip-chip mounting are connected to the ground contact portion 26e via bumps 30. Pads other than the ground pads 16A and 16B are connected to interconnection lines 28 on the wiring board 24 via bumps such as solder bumps. The ground contact portion 26e is common to the switches SW1 and SW2 and is located so as to equally divide the semiconductor chip 14 into two parts, and runs in the transverse direction of the semiconductor chip 14. The ground contact portion 26e thus arranged further strengthens the isolation between the switches SW1 and SW2, as compared to a case where the ground pads 16A and 16B are individually set at the ground potential. FIGS. 8A and 8B show an electronic device equipped with the wiring board 24 and the high-frequency switch device 100 mounted thereon in flip-ship style.

Figure 9A:
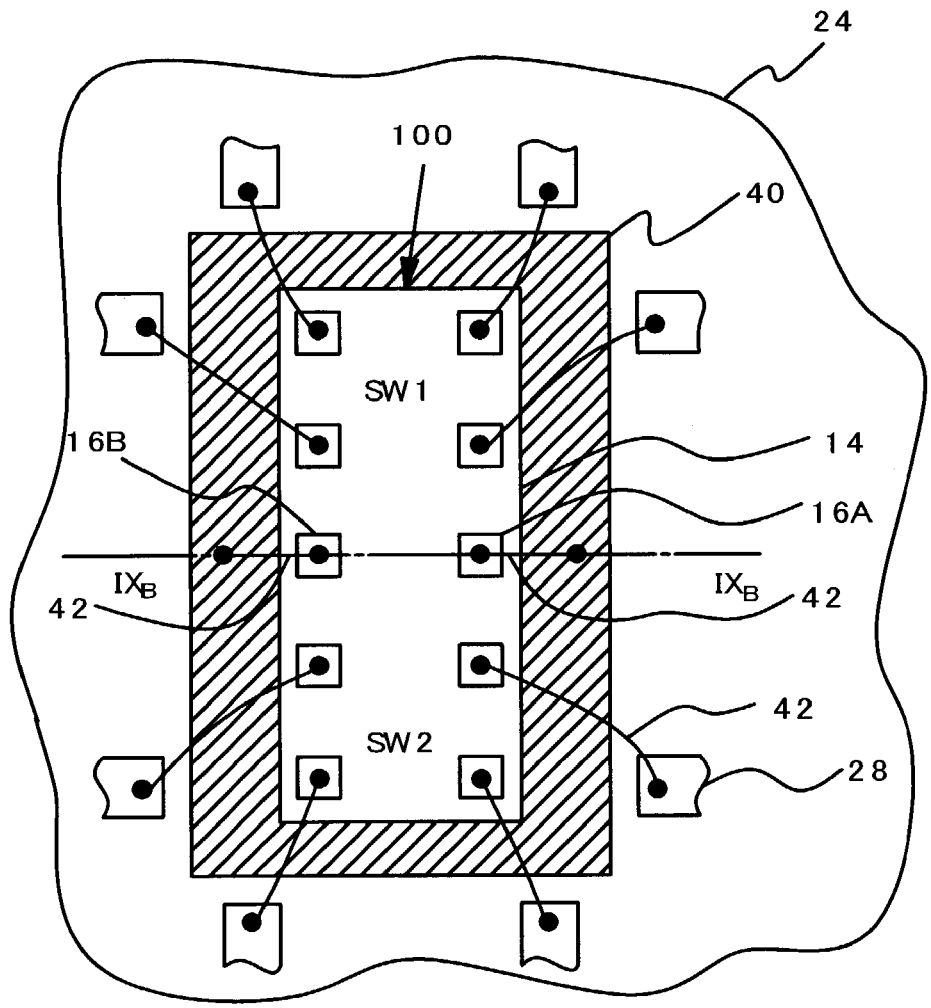
FIG. 9A is a plan view of another electronic device equipped with the high-frequency switch device mounted on a wiring board in face-up style according to the first embodiment of the present invention.
Figure 9B:
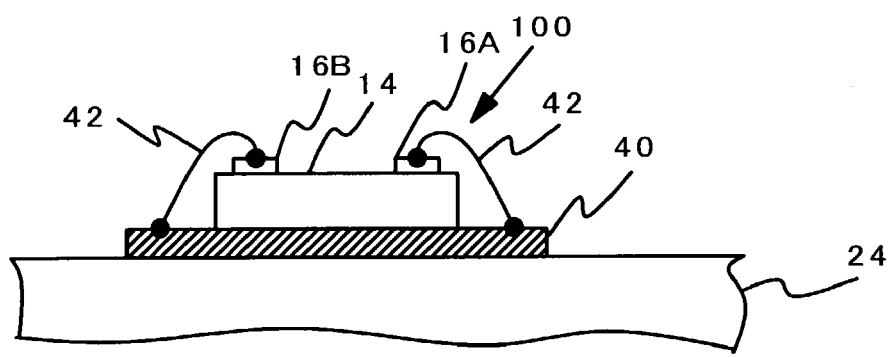
FIG. 9B is a cross-sectional view taken along a line $IX_B$—$IX_B$ shown in FIG. 9A.

FIG. 9A shows another mounting method of the high-frequency switch device 100 according to the first embodiment of the present invention. FIG. 9B is a cross-sectional view taken along a line IX$_B$—IX$_B$ shown in FIG. 9A. The high-frequency switch device 100 is mounted in such a manner that the circuit surface (front surface) of the semiconductor chip 14 on which the FETs and pads are formed faces upward (face-up mounting). The back or bottom surface of the semiconductor chip 14 opposite to the circuit surface is mounted on a ground metal 40 formed on the wiring board 24. The ground metal 40 has an area greater than that of the bottom surface of the semiconductor chip 14 so that the whole bottom surface of the semiconductor chip 14 contacts the ground metal 40. The ground pads 16A and 16B are connected to an exposed portion of the ground metal 40 by bonding wires 42. The pads other than the ground pads 16A and 16B are connected to the interconnection lines 28 on the wiring board 24 by bonding wires 42.

Figure 10:
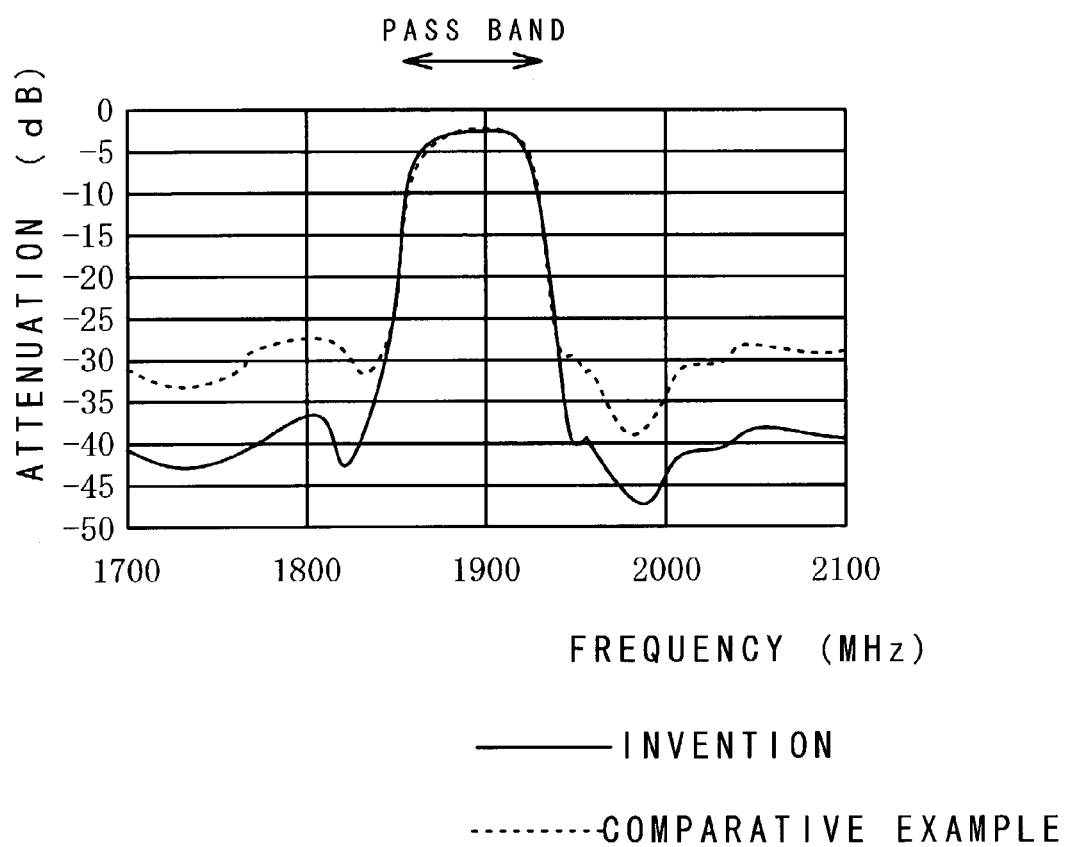
FIG. 10 is a graph of the frequency characteristics of a filter device equipped with the high-frequency switch device according to the first embodiment of the present invention and the comparative example.

FIG. 10 shows the frequency characteristics of two filter devices. One of the filter devices employs the high-frequency switch device 100 shown in FIG. 5 or FIGS. 7A–7C, and has a circuit configuration as shown in FIG. 4A. This device is illustrated as "present invention" in FIG. 10. The other filter device employs the layout of the comparative example 110 shown in FIG. 6, and has a circuit configuration as shown in FIG. 4A. The two filter devices use the flip-chip mounting. According to the present invention, the original out-of-band suppression (−40 dB) of the filter is available because the ground pads 16A and 16B are provided between the switches SW1 and SW2 and function to reduce the electromagnetic coupling therebetween. In contrast, the out-of-band suppression of the comparative example 110 is lower than the original out-of-band suppression due to strong electromagnetic coupling between the switches SW1 and SW2.

(Second Embodiment)

Figure 11A:
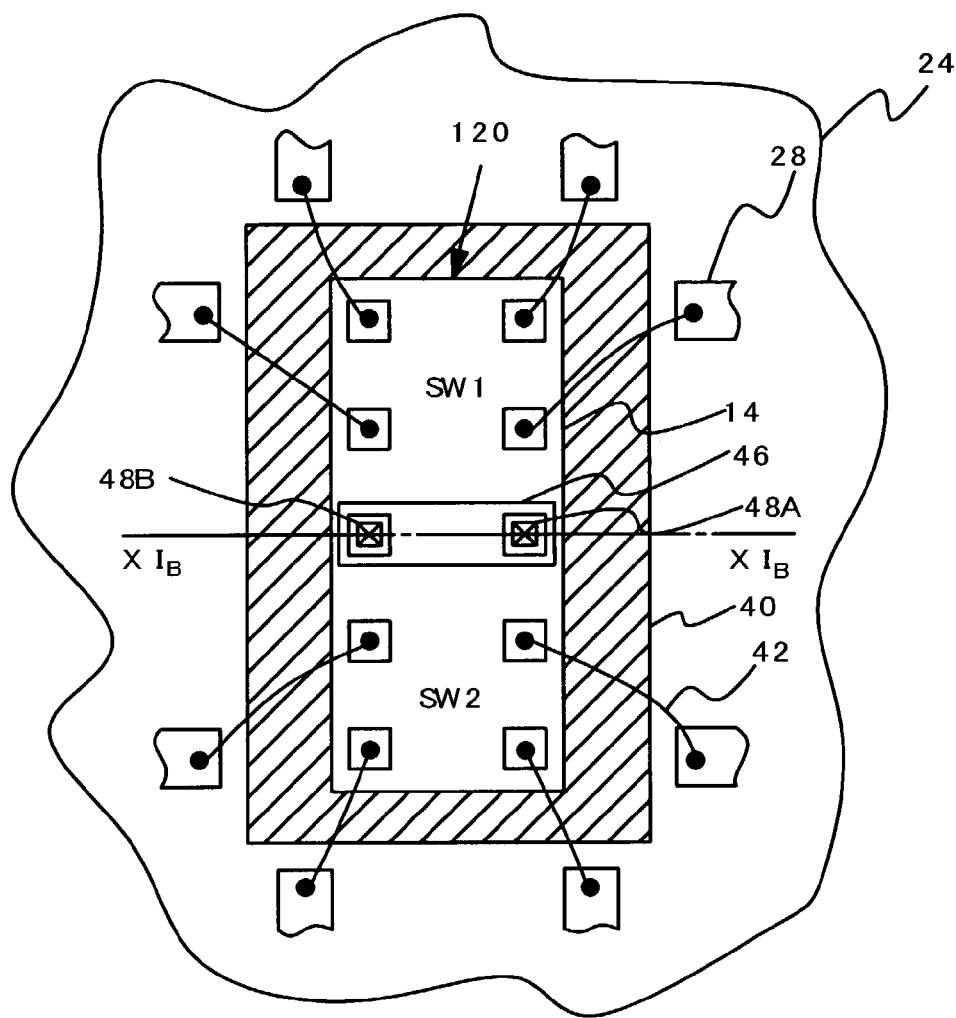
FIG. 11A is a schematic plan view of an electronic device equipped with a high-frequency switch device according to a second embodiment of the present invention.
Figure 11B:
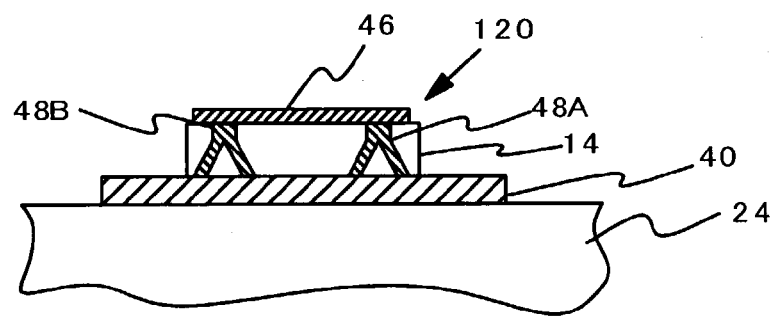
FIG. 11B is a cross-sectional view taken along a line $XI_B$—$XI_B$ shown in FIG. 11A.

FIG. 11A is a plan view of a second embodiment of the present invention, and FIG. 11B is a cross-sectional view taken along a line XI$_B$–XI$_B$ shown in FIG. 11A. The second embodiment of the present invention relates to a high-frequency switch device and an electronic device equipped with the same. A high-frequency switch device 120 is mounted on the ground metal 40 on the wiring board 24. The circuit surface of the semiconductor chip 14 faces upward. A ground pattern 46 is provided on the circuit surface of the semiconductor chip 14. The ground pattern 46 is located in the middle of the semiconductor chip 14 and is interposed between the switches SW1 and SW2. The ground pattern 46 runs in the transverse direction. Vias 48A and 48B are formed in the semiconductor chip 14 for making external connections therewith. The vias 48A and 48B penetrate through the semiconductor chip 14 and extends up to the back surface of the semiconductor chip 14. The vias 48A and 48B have respective through holes that are full of an electrically conductive material. The ends of the bias 48A and 48B protrude from the back surface (mount surface) of the semiconductor chip 14, and contact the ground metal 40 on the wiring board 24. In order to ensure the reliability of the contacts, each of the vias 48A and 48B branches into two or more parts within the semiconductor chip 14.

According to the second embodiment of the present invention, the electromagnetic coupling between the switches SW1 and SW2 can be reduced due to the ground pattern 46 provided on the circuit surface of the semiconductor chip 14 and arranged so as to separate the switches SW1 and SW2 from each other. It is therefore possible to increase the integration density and miniaturize the semiconductor chip size.

(Third Embodiment)

Figure 12A:
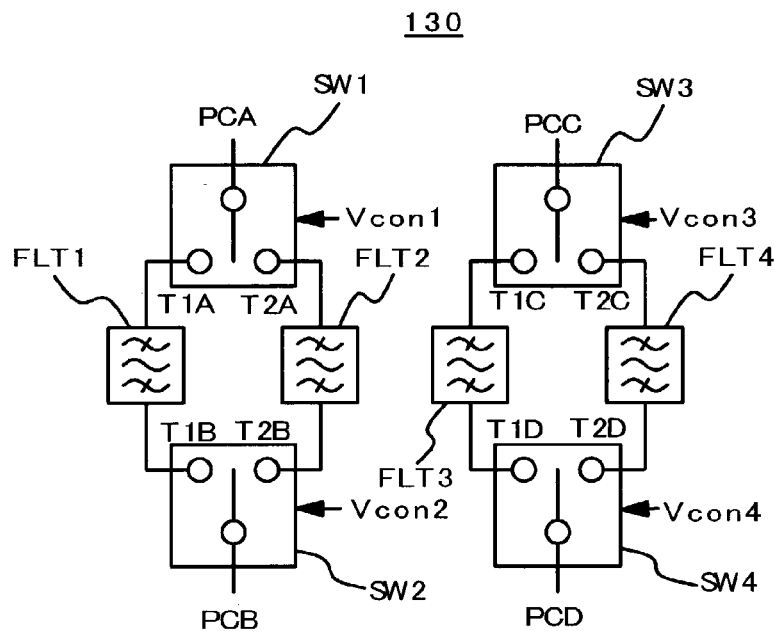
FIG. 12A is a circuit diagram of an electronic device equipped with a high-frequency switch device according to a third embodiment of the present invention.
Figure 12B:
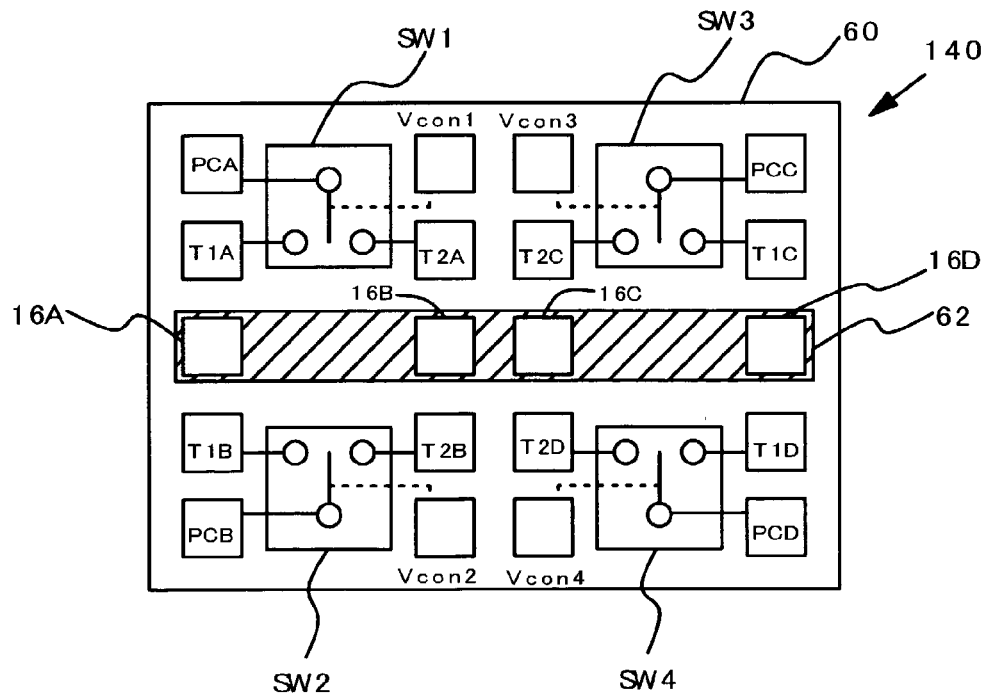
FIG. 12B is a schematic plan view of the high-frequency switch device used in the electronic device shown in FIG. 12A.

FIG. 12A is a circuit diagram of a filter device equipped with high-frequency switch devices according to a third embodiment of the present invention, and FIG. 12B is a schematic plan view of a high-frequency switch device used in the filter device shown in FIG. 12A. The high-frequency switch device according to the present embodiment is one of examples, each having three or more switches mounted on a single semiconductor chip. The high-frequency switch device shown in FIGS. 12A and 12B have four switches SW1–SW4.

A filter switch 130 shown in FIG. 12A is equipped with four switches SW1-SW4 and four filters FLT1–FLT4. The switches SW1 and SW2 are provided on a signal line and selectively connect one of the filters FLT1 and FLT2 having mutually different filter characteristics to the signal line. Similarly, the switches SW3 and SW4 are provided on another signal line and selectively connect one of the filters FLT3 and FLT4 having mutually different filter characteristics to the signal line. For example, the filter FLT3 is connected between the stationary contact T1C of the switch SW3 and the stationary contact T1D of the switch SW4. The filter FLT4 is connected between the stationary contact T2C of the switch SW3 and the stationary contact T2D of the switch SW4. The switches SW3 and SW4 cooperate with each other to cause a signal applied to the movable contact PCC of the switch SW3 to pass through either the filter FLT3 or FLT4, the signal being then output via the movable contact PCD. The states of the switches SW1–SW4 shown in FIG. 4A are available when control voltages Vcon1–Vcon4 are all OFF.

As shown in FIG. 12B, a high-frequency switch device 140 equipped with the switches SW1–SW4 is formed on a semiconductor chip 60. The switches SW1–SW4 are arranged in matrix formation. On the circuit surface of the semiconductor chip 60, provided are the ground pads 16A, 16B, 16C and 16D of the switches SW1–SW4. The ground pads 16A, 16B, 16C and 16D are arranged in line. This arrangement functions to electromagnetically separate the switches SW1 and SW2 from each other and separate the switches SW3 and SW4 from each other. The line arrangement of the ground pads 16A–16D separate the switches SW1–SW4 into two groups, one of which is composed of switches SW1 and SW3, and the other is composed of switches SW2 and SW4. When the ground pads 16A–16D are set at the ground potential, a ground region 62 is formed as shown in FIG. 12B. The ground region 62 reduces the electromagnetic coupling between the switches SW1 and SW2 and that between the switches SW3 and SW4.

The technique employed in the second embodiment of the present invention may be applied to the high-frequency switch device 140 shown in FIG. 12B. A region 62 to which hatching is given may be a real ground pattern provided on the circuit surface of the semiconductor chip 60. An external connection to the ground pattern 62 may be made on the back surface of the semiconductor chip 60 by means of vias formed at the positions indicated by the reference numerals 16A–16D.

(Fourth Embodiment)

Figure 13A:
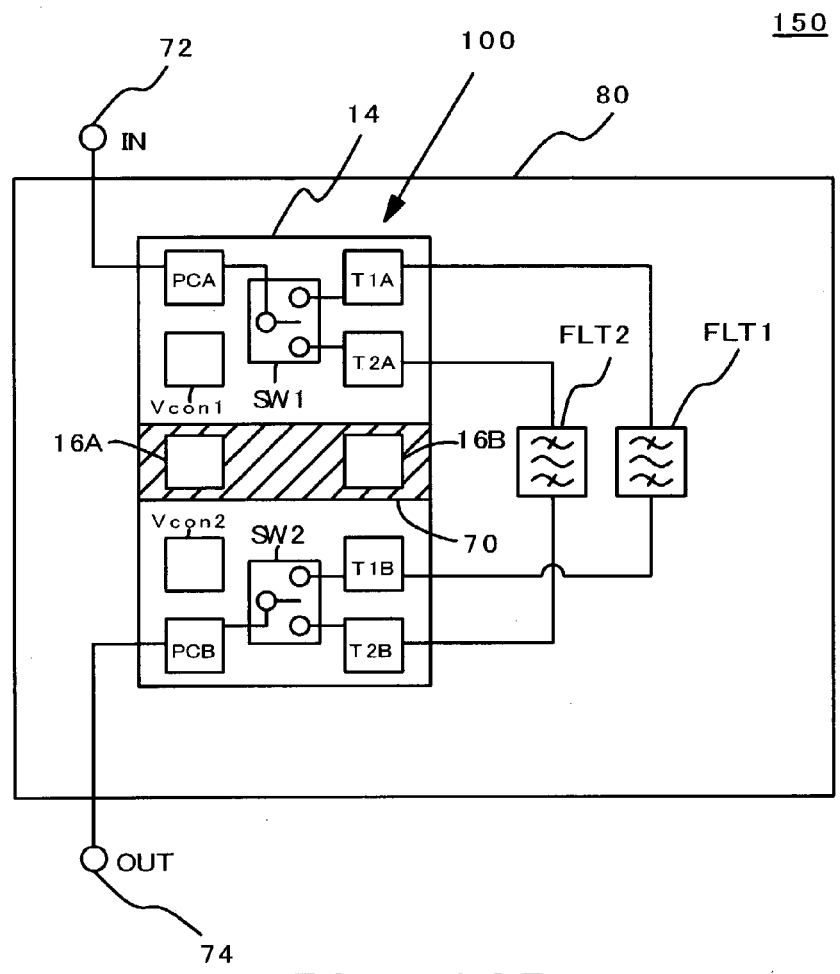
FIG. 13A is a circuit diagram of an electronic device serving as a filter device according to a fourth embodiment of the present invention.
Figure 13B:
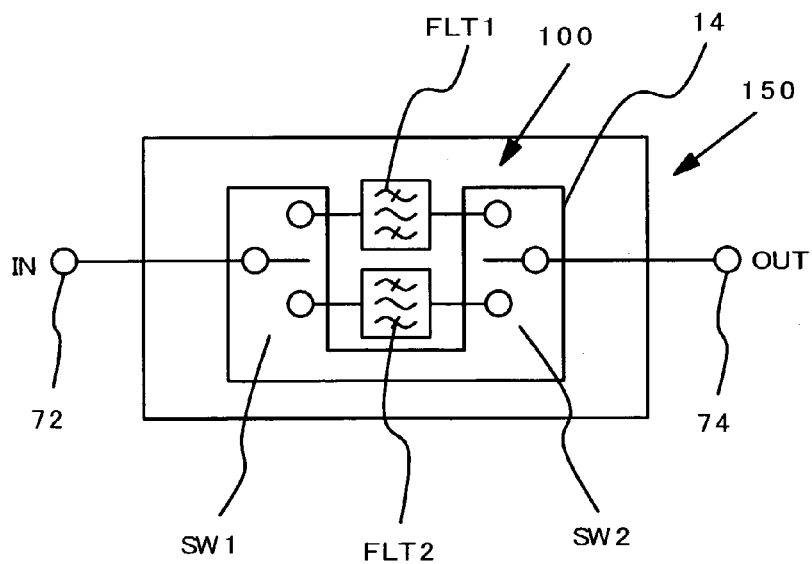
FIG. 13B is a circuit diagram of a high-frequency switch device used in the electronic device shown in FIG. 13A.

FIG. 13A is a circuit diagram of a filter device according to a fourth embodiment of the present invention, and FIG. 13B is a circuit diagram of a high-frequency switch device used in the filter device in FIG. 13A.

As shown in FIG. 13A, a filter device or module 150 is equipped with a high-frequency switch device 100 and two filters FLT1 and FLT2, these components being housed in a package 80 made of, for example, ceramics. The filter device 150 has an input terminal 72 and an output terminal 74 supported by the package 80. An input signal IN is applied to the input terminal, and an output signal OUT is obtained via the output terminal 74. The high-frequency switch device 100 is mounted on the wiring board 24 in such a manner as shown in FIGS. 8A and 8B or FIGS. 9A and 9B. The filters FLT1 and FLT2 are also mounted on the wiring board 24. The high-frequency switch device 100 and the filers FLT1 and FLT2 are electrically connected by the interconnection or wiring lines 28 as shown in FIGS. 8A and 8B or FIGS. 9A and 9B. For flip-chip mounting shown in FIGS. 8A and 8B, a hatched portion indicated by a reference numeral of 70 corresponds to the aforementioned ground contact portion 26e. For the mounting shown in FIGS. 9A and 9B, the portion 70 corresponds to the ground region. When the high-frequency switch device 120 is substituted for the switch device 100, the portion 70 in FIG. 13A corresponds to the ground pattern 46 formed on the circuit surface of the semiconductor chip 14.

The switches SW1 and SW2 on the semiconductor chip 14 are arranged in a unique formation, which is different from the formations of the first through third embodiments of the present invention. The signal terminals T1A and T2A, which correspond to the two stationary contacts of the switch SW1 are arranged in line along an edge of the semiconductor chip 14. The signal terminals T1A and T2A are arranged on the same side of the semiconductor chip 14. Similarly, the signal terminals T1B and T2B, which correspond to the two stationary contacts of the switch SW2, are arranged in line along the same edge (the same side) of the semiconductor chip 14. The signal terminals T1A, T2A, T1B and T2B provided on the same side of the semiconductor chip 14 may make connections with external components in a short distance. FIG. 13B shows an example of the above arrangement. Even in this example, the ground pads 16A and 16B are interposed between the switches SW1 and SW2, so that sufficient isolation can be secured therebetween.

The filter device thus configured has the characteristic shown by the solid line in FIG. 10. In addition, the high-frequency switch device 100 is downsized and highly integrated, so that the filter device 150 can also be downsized and highly integrated. The filters FLT1 and FLT2 may, for example, be surface acoustic wave filters in which surface acoustic resonators are connected in ladder formation.

(Fifth Embodiment)

Figure 14:
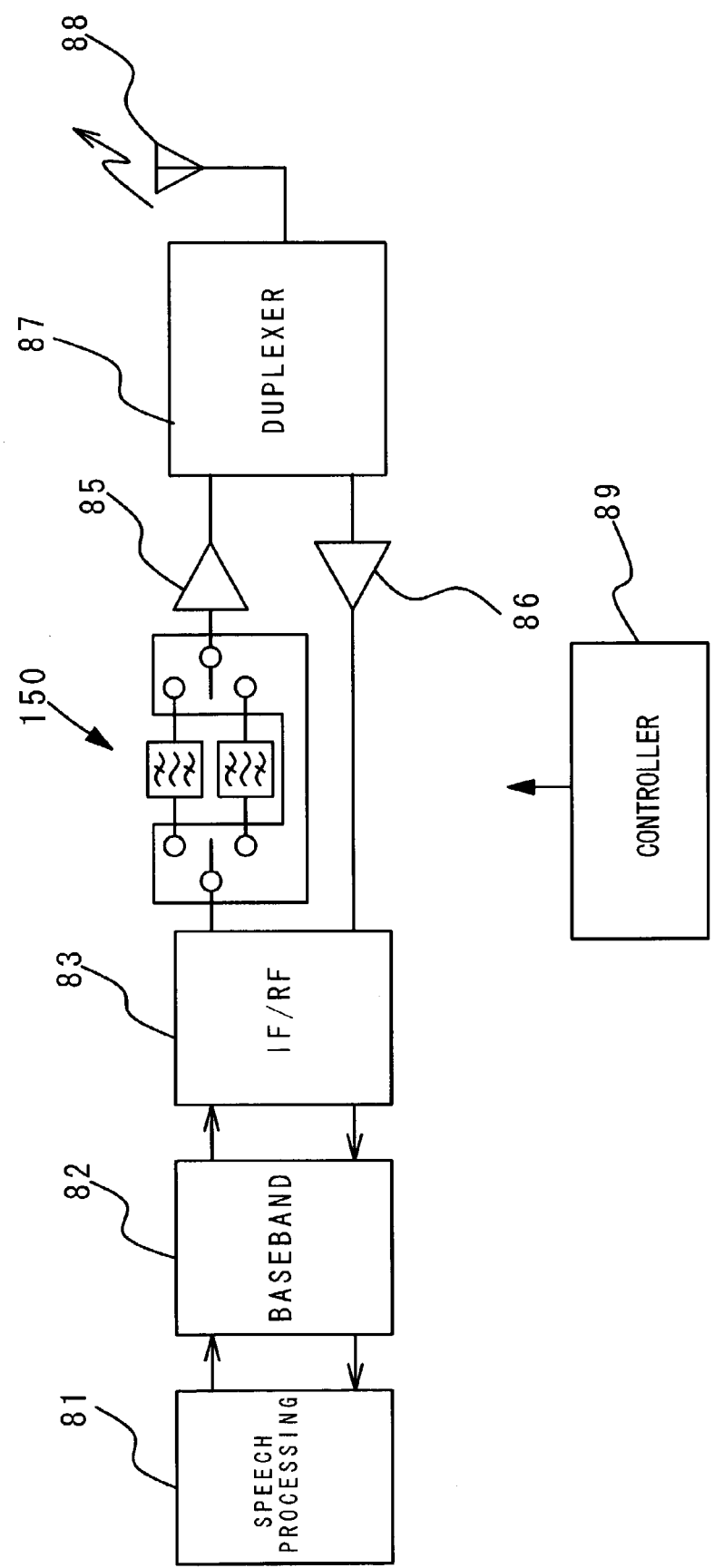
FIG. 14 is a block diagram of an electronic device according to a fifth embodiment of the present invention.

FIG. 14 is a block diagram of an electronic device according to a fifth embodiment of the present invention. This electronic device is a radio communication device such as a cellular phone or a PDA (Personal Digital Assistant). The radio communication device, which is also an electronic device, is equipped with, as signal processing circuits, a speech processing circuit 81, a baseband circuit 82, an intermediate frequency (IF)/radio wave (RF) circuit 83, a power amplifier 85, a low-noise amplifier 86, an antenna duplexer 87, an antenna 88 and a controller 89. Further, the radio communication device has the filter device or module 150, which is used in a transmission system, in which one of the filters that matches the tuned transmission frequency is selected. The switches SW1 and SW2 of the filter device 150 are controlled by the control voltages Vcon1 and Vcon2 output by the controller 89.

The present invention is not limited to the specifically disclosed embodiments, and other embodiments, variations and modifications may be made without departing from the scope of the present invention. For example, the PSDT switches used in the above-mentioned embodiments of the present invention may be replaced by any of the other types of switches such as DPDT (Dual Pole Dual Throw) and SPNT (Single Pole N(integer) Throw) switches.

The present invention is based on Japanese patent application no. 2002-093376 filed on Mar. 28, 2002, the entire disclosure of which is hereby incorporated by reference.

What is claimed is:

1. A switch device comprising:
a semiconductor chip; and
at least two switches formed on the semiconductor chip, ground parts of said at least two switches being arranged between said at least two switches,
the ground parts of said at least two switches are ground terminals located in a spacing between said at least two switches, said ground terminals are arranged on an imaginary line that runs in a direction perpendicular to the direction in which said at least two switches are located in each side of said imaginary lines,
wherein the ground terminals are located closer to terminals corresponding to stationary contacts of said at least two switches than terminals corresponding to movable contacts thereof.

2. The switch device according to claim 1, wherein:
signal terminals corresponding to stationary contacts of said at least two switches are located in each side of the ground terminals.

3. The switch device according to claim 1, wherein the ground parts of said at least two switches are provided on a surface of the semiconductor chip on which said at least two switches are formed.

4. The switch device according to claim 1, wherein the ground parts of said at least two switches are formed by a patterned ground metal common to said at least two switches.

5. The switch device according to claim 1, wherein:
the ground parts of said at least two switchers include a patterned ground metal common to said at least two switches; and
the patterned ground metal is connected to vias formed in the semiconductor chip for making external connections, the vias extending up to a back surface of the semiconductor chip opposite to a front surface thereof on which said at least two switches are formed.

6. The switch device according to claim 1, wherein said at least two switches are provided in an identical signal line.

7. The switch device according to claim 1, wherein three or more switches are formed on the semiconductor chip and are arranged in line so as to divide said three or more switches into two groups.

8. The switch device according to claim 1, wherein stationary contacts of said at least two switches are arranged along one edge of the semiconductor chip.

9. The switch device according to claim 1, wherein stationary contacts of said at least two switches are arranged along two opposing edges of the semiconductor chip.

10. The switch device according to claim 1, wherein the semiconductor chip is made of a compound semiconductor.

11. A switch device comprising:
a semiconductor chip;
at least two switches formed on the semiconductor chip; and
a ground member, arranged between said at least two switches, for reducing an electromagnetic coupling between stationary contacts of said at least two switches,
the ground member including ground terminals of said at least two switches,
said ground terminals being arranged between said at least two switches, said ground terminals are arranged on an imaginary line that runs in a direction perpendicular to the direction in which said at least two switches are located in each side of said imaginary line,
wherein the ground terminals are located closer to terminals corresponding to stationary contacts of said at least two switches than terminals corresponding to movable contacts thereof.

12. The switch device according to claim 11, wherein the ground member comprises a patterned ground metal arranged between said at least two switches.

13. The switch device according to claim 11, wherein the semiconductor chip is made of a compound semiconductor.

14. An electronic device comprising:
a switching device; and
a wiring board on which the switch device is mounted,
the switch device comprising a semiconductor chip and at least two switches formed on the semiconductor chip, ground parts of said at least two switches being provided between said at least two switches and being electrically connected to a ground formed on the wiring board,
wherein: the ground parts of said at least two switches are pads;
the switch device is mounted on the wiring board in flip-chip style;
the wiring board comprises a ground contact pattern to which the pads of said at least two switches are connected, and
the ground contact pattern is located so as to divide said at least two switches into two groups in a state in which the switch device is mounted on the wiring board.

15. The electronic device according to claim 14, wherein:
the wiring board has a ground metal that contacts a mount surface of the semiconductor chip of the switch device; and
the ground parts of said at least two switches are pads provided on the semiconductor chip, said pads being connected to the ground metal by bonding wires.

16. An electronic device comprising:
a switching device; and
a wiring board on which the switch device is mounted,
the switch device comprising a semiconductor chip and at least two switches formed on the semiconductor chip, ground parts of said at least two switches being provided between said at least two switches and being electrically connected to a ground formed on the wiring board,
wherein: the ground parts are formed by a first ground metal common to said at least two switches and provided on a first surface of the semiconductor chip;
the semiconductor chip has vias connected to the first ground metal; and
the vias are connected to a second ground metal that is formed on the wiring board and contacts a second surface of the semiconductor chip opposite to the first surface.

17. An electronic device comprising:
a switch device in a package and components connected to the switch device,
the switch device comprising a semiconductor chip and at least two switches formed on the semiconductor chip, said at least two switches being separated from each other by 1 mm or less and having respective ground portions provided between said at least two switches, the switch device selectively connecting the components between input and output terminals supported by the package, the ground parts of said at least two switches are ground terminals located in a spacing between said at least two switches, said ground terminals are arranged on an imaginary line that runs in a direction perpendicular to the direction in which said at least two switches are located in each side of said imaginary line, wherein the ground terminals are located closer to terminals corresponding to stationary contacts of said at least two switches than terminals corresponding to movable contacts thereof.

18. The electronic device according to claim 17, wherein the components are respectively filters having different characteristics.

19. An electronic device comprising:

a signal processing circuit and a module, the module comprising a switch device and components, the switch device comprising a semiconductor chip and at least two switches mounted on the semiconductor chip, said at least two switches being separated from each other by 1 mm or less and having respective ground portions provided between said at least two switches, the switch device selectively connecting the components between input and output terminals of the module, the ground parts of said at least two switches are ground terminals located in a spacing between said at least two switches, said ground terminals are arranged on an imaginary line that runs in a direction perpendicular to the direction in which said at least two switches are located in each side of said imaginary lines, wherein the ground terminals are located closer to terminals corresponding to stationary contacts of said at least two switches than terminals corresponding to movable contacts thereof.

20. The electronic device according to claim 19, wherein the components are respectively filters having different characteristics.

* * * * *